United States Patent [19]
Antone

[11] Patent Number: 5,434,527
[45] Date of Patent: Jul. 18, 1995

[54] GATE DRIVE CIRCUIT

[75] Inventor: James A. Antone, Peoria, Ill.

[73] Assignee: Caterpillar Inc., Peoria, Ill.

[21] Appl. No.: 140,934

[22] Filed: Oct. 25, 1993

[51] Int. Cl.⁶ ............................................. H03K 17/16
[52] U.S. Cl. ................... 327/391; 327/190; 327/309; 327/379; 327/389; 327/434
[58] Field of Search .............. 307/282, 299.1, 571, 307/572, 575, 576, 581, 584, 585; 327/190, 379, 389, 391, 427, 434, 435, 436, 309, 310, 314

[56] References Cited

U.S. PATENT DOCUMENTS

| | | | |
|---|---|---|---|
| 4,052,623 | 10/1977 | Loberg | 307/282 |
| 4,461,966 | 7/1984 | Hebenstreit | 307/571 |
| 4,469,962 | 9/1984 | Snyder | 307/572 |
| 4,511,815 | 4/1985 | Wood | 307/584 |
| 4,603,269 | 7/1986 | Hochstein | 307/575 |
| 4,710,645 | 12/1987 | Doittau et al. | 307/571 |
| 4,970,420 | 11/1990 | Billings | 307/571 |
| 5,010,261 | 4/1991 | Steigerwald | 307/584 |
| 5,051,613 | 3/1991 | Houser, Jr. et al. | 307/584 |
| 5,068,553 | 11/1991 | Love | 307/585 |
| 5,134,320 | 7/1992 | Perusse | 307/581 |
| 5,304,863 | 4/1994 | Cargille | 307/282 |

*Primary Examiner*—Terry D. Cunningham
*Attorney, Agent, or Firm*—Stephen L. Noe

[57] ABSTRACT

A circuit includes a high voltage energy source, a power transistor having a drain connected to the energy source and a source connected to a load, and a first capacitor connected between the power transistor gate and source. Also included is a first P-channel transistor connected in parallel with the first capacitor, and a second capacitor connected between the first P-channel transistor gate and drain. A transformer delivers positive voltage to the first capacitor to bias the power transistor ON, and delivers negative voltage to the second capacitor to bias the first P-channel transistor ON, which causes the energy stored in the first capacitor to discharge; thereby biasing the power transistor OFF.

7 Claims, 1 Drawing Sheet

GATE DRIVE CIRCUIT

TECHNICAL FIELD

This invention relates generally to a gate drive circuit for a transistor and, more particularly, to an gate drive circuit for a transistor that controls high voltage to a capacitive load.

BACKGROUND ART

Power transistors are commonly used to control high voltages to a load. For example, the power transistor is positioned between a high voltage energy source and a load. The power transistor is biased alternately ON and OFF to control the flow of energy to the load. Thus the power transistor is biased ON to pass a high voltage, then OFF to block the high voltage. Since the switching time may relatively small, the DV/DT may relatively high. This high level of DV/DT causes severe stress on the switch input (the gate to source), which can cause false ON states and ringing effects that is due to the parasitic gate to drain capacitance.

The present invention is directed to overcoming one or more of the problems as set forth above.

DISCLOSURE OF THE INVENTION

In one aspect of the present invention a gate drive circuit is disclosed. The gate drive circuit includes a high voltage energy source, a power transistor having a drain connected to the energy source and a source connected to a load, and a first capacitor connected between the power transistor gate and source. Also included is a first P-channel transistor connected in parallel with the first capacitor, and a second capacitor connected between the first P-channel transistor gate and drain. A circuit delivers positive voltage to the first capacitor to bias the power transistor ON, and delivers negative voltage to the second capacitor to bias the first P-channel transistor ON, which causes the energy stored in the first capacitor to discharge; thereby biasing the power transistor OFF.

BRIEF DESCRIPTION OF THE DRAWINGS

For a better understanding of the present invention, reference may be made to the accompanying drawings in which.

BEST MODE FOR CARRYING OUT THE INVENTION

Figure 1:
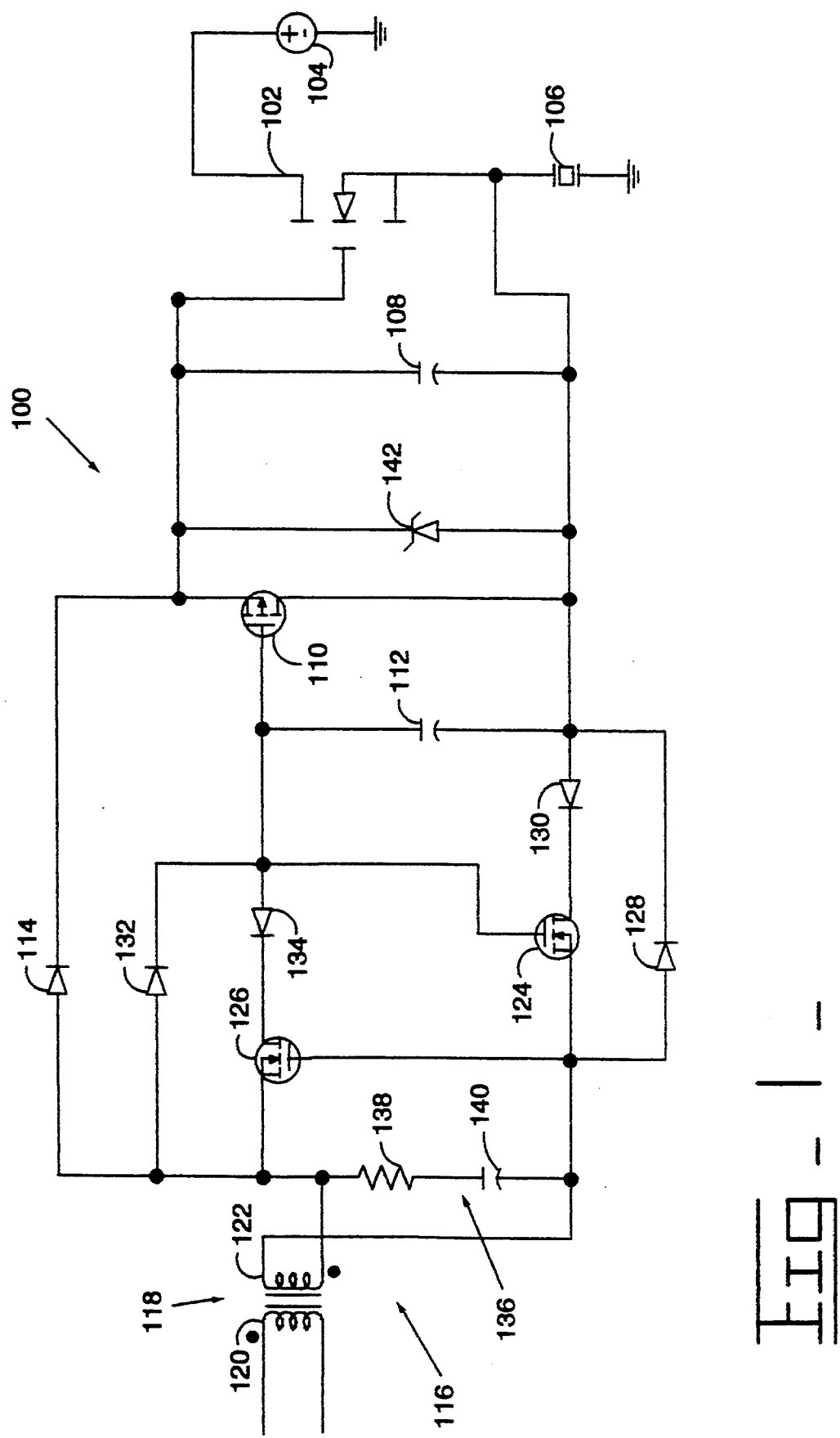
FIG. 1 shows a gate drive circuit associated with a preferred embodiment of the present invention.

Referring now to the drawings, wherein a preferred embodiment of the present invention is shown, FIG. 1 illustrates a gate drive circuit 100. The gate drive circuit 100 controls the state of a power transistor 102. The power transistor 102 acts as a high voltage switch to regulate current from a high voltage energy source 104 to a load 106. For example, the load may be a capacitive load, such as a piezoelectric actuator. As shown, the power transistor drain is connected to the energy source 104, and the power transistor source is connected to the load 106. The power transistor 102 may be of MOSFET or IGBT construction, for example.

A first capacitor 108 is connected between the power transistor gate and source. The first capacitor 108 stores energy to bias the first transistor 102. A first P-channel transistor 110 is connected in parallel with the first capacitor 108. The first P-channel transistor 110 provides a path to discharge the first capacitor 108, as well as, a low impedance across the power transistor 102. A second capacitor 112 is provided to bias the first P-channel transistor 110. The second capacitor 112 is connected between the first P-channel transistor gate and drain.

A means 116 delivers positive and negative voltage pulses to cause the power transistor 102 to bias ON and OFF. For example, a positive voltage pulse delivered to the first capacitor 108, via a first diode 114, biases the power transistor 102 ON; and a negative voltage pulse delivered to the second capacitor 112 biases the first P-channel transistor 110 ON, which discharges the first capacitor 108 to bias the power transistor 102 OFF.

The means 116 includes a transformer 118. The transformer 118 provides electrical isolation between the gate drive circuit 100 and any control circuitry (not shown). The transformer primary winding 120 is wound at a 1:1 ratio with the transformer secondary winding 122. The means 116 also includes a pair of N-channel MOSFETs 124,126 to provide positive and negative energy to the second capacitor 112. As shown, a first N-channel MOSFET 124 is connected between the transformer secondary "high side" and the second capacitor 112. A second N-channel transistor 126 is connected between the transformer secondary "low side" and the second capacitor 112.

The first and second N-channel MOSFETs each include a pair of diodes to limit reverse leakage current, and to slow the "turn-off" of an internal parasitic drain-source body diode that is associated with each MOSFET 124,126.

As shown, the diode pair 128,130 is connected across the source and drain of the first N-channel MOSFET 124. For example, the diode 130 cancels the internal drain-source body diode associated with the first MOSFET 124, and the diode 128 provides a shunt for the first MOSFET 124. Similarly, the diode pair 132,134 is connected across the source and drain of the second N-channel MOSFET 126. For example, the diode 134 cancels the internal drain-source body diode associated with the second MOSFET 126, and the diode 132 provides a shunt for the second MOSFET 126.

An RC snubber circuit 136 is provided across the transformer 122. As shown, the snubber circuit 136 includes a resistor 138 and capacitor 140 that are connected in series. Finally, a Zener diode 142 is included to protect the power transistor 102 against damaging voltages. As shown, the Zener diode 142 is connected across the gate-source of the power transistor 102.

INDUSTRIAL APPLICABILITY

The operation of the present invention is now described. To charge the load 106, a control pulse having a magnitude of 10 volts is delivered to the high side of the primary winding 120, which produces +10 volts across the secondary winding 122. Accordingly, the first diode 114 is biased ON to charge the first capacitor 108 to approximately +10 volts. Additionally, the first N-channel MOSFET 124 is biased ON to charge the second capacitor 112 to approximately +10 volts, which causes the P-channel MOSFET 110 to be biased OFF. Consequently, the power transistor 102 is biased ON in response to its gate being +10 volts greater than its source. Energy is then delivered from the energy source 104 to the load 106. Note that the power transistor gate remains +10 volts greater than the source, even though the source voltage floats from a low voltage to a high voltage. For example the energy source 104 may produce voltages upwards to 750 volts, yet the power transistor remains biased ON.

It may be desired to control the amount of energy delivered to the load 106 by alternately biasing the power transistor 102 ON and OFF. To bias the power transistor 102 OFF, a control pulse having a magnitude of 10 volts is delivered to the primary winding "low-side" to produce −10 volts across the secondary winding 122. Responsively, the second N-channel MOSFET 126 is biased ON to reverse the voltage polarity across the second capacitor 112 to create approximately a −10 volt voltage differential between the gate and drain of the P-channel MOSFET 110. The voltage differential biases the P-channel MOSFET 110 ON to provide a path for the first capacitor 108 to discharge the stored voltage. Once the voltage across the first capacitor 108 falls below a predetermined voltage level, the power transistor 102 is biased OFF.

Even though the switching time may be 300 nano seconds creating a DV/DT of 2000 volts per second, the present invention provides a gate drive circuit 100 that eliminates false ON states and ringing effects caused by the parasitic gate-drain capacitance, i.e. Miller Effect. For example, the P-channel MOSFET provides a low impedance across the gate to source of the power transistor 102 during "turn-off"; thereby "shorting" the power transistor drain to gate coupling.

Other aspects, objects and advantages of the present invention can be obtained from a study of the drawings, the disclosure and the appended claims.

I claim:

1. A circuit, comprising:
   a high voltage energy source;
   a power transistor having a drain connected to the energy source and a source being connected to a load;
   a first capacitor being connected between the power transistor gate and source;
   a first P-channel transistor being connected in parallel with the first capacitor;
   a second capacitor being connected between the first P-channel transistor gate and drain; and
   means for delivering positive voltage to the first capacitor to bias the power transistor ON, and delivering negative voltage to the second capacitor to bias the first P-channel transistor ON causing the energy stored in the first capacitor to discharge to bias the power transistor OFF, the means including:
   a transformer having a primary and secondary winding;
   a first N-channel transistor being connected between the high-side of the secondary transformer winding and the second capacitor, the first N-channel transistor having an internal drain-source body diode; and
   a first pair of diodes, one of the first pair being connected between the first N-channel transistor drain and the second capacitor cancel the effect of the internal drain-source body diode associated with the first N-channel transistor, the other one of the first pair being connected between the first N-channel transistor source and the second capacitor to provide a shunt for the first N-channel transistor.

2. A circuit, as set forth in claim 1, wherein the means further includes:
   a second N-channel transistor being connected between the low-side of the secondary transformer winding and the second capacitor, the second N-channel transistor having an internal drain-source body diode; and
   a second pair of diodes, one of the second pair being connected between the second N-channel transistor drain and the second capacitor to cancel the effect of the internal drain-source body diode associated with the second N-channel transistor, the other one of the second pair being connected between the second N-channel transistor source and the second capacitor to provide a shunt for the second N-channel transistor.

3. A circuit, as set forth in claim 2, including an RC snubber circuit connected across the secondary transformer winding.

4. A circuit, as set forth in claim 3, including a Zener diode connected in parallel with the first capacitor.

5. A circuit, as set forth in claim 4, wherein the power transistor is a N-channel MOSFET.

6. A circuit, as set forth in claim 5, wherein the first P-channel transistor is a P-channel MOSFET and the first and second N-Channel transistors are N-channel MOSFETs.

7. A circuit, as set forth in claim 6, wherein the load is a piezoelectric actuator.

* * * * *